(12) United States Patent
Sumiyoshi et al.

(10) Patent No.: US 10,364,153 B2
(45) Date of Patent: Jul. 30, 2019

(54) PARTICLE PRODUCTION APPARATUS, PARTICLE PRODUCTION METHOD AND METHOD FOR PRODUCING SEMICONDUCTOR ENCAPSULATING RESIN COMPOSITION (71) Applicant: SUMITOMO BAKELITE COMPANY LIMITED, Tokyo (JP)

(72) Inventors: Takafumi Sumiyoshi, Tokyo (JP); Hiroshi Shibata, Tokyo (JP)

(73) Assignee: SUMITOMO BAKELITE COMPANY LIMITED, Tokyo (JP)

(*) Notice: Subject to any disclaimer, the term of this patent is extended or adjusted under 35 U.S.C. 154(b) by 102 days.

(21) Appl. No.: 15/791,907

(22) Filed: Oct. 24, 2017

(65) Prior Publication Data
US 2018/0044190 A1 Feb. 15, 2018

Related U.S. Application Data (62) Division of application No. 13/581,923, filed as application No. PCT/JP2011/053914 on Feb. 23, 2011, now Pat. No. 9,828,252.

(30) Foreign Application Priority Data

Mar. 25, 2010 (JP) .................. 2010-071116

(51) Int. Cl.
B01J 2/00 (2006.01)
C01B 33/18 (2006.01)
(Continued)

(52) U.S. Cl.
CPC .............. C01B 33/18 (2013.01); B01J 2/006 (2013.01); C01P 2004/61 (2013.01);
(Continued)

(58) Field of Classification Search
CPC .................. B01J 2/006; C01B 33/18
See application file for complete search history.

(56) References Cited

U.S. PATENT DOCUMENTS 5,096,744 A 3/1992 Takei et al.
5,447,567 A * 9/1995 Tanaka ............... B01J 2/006
118/303
(Continued)

FOREIGN PATENT DOCUMENTS

CN 1675003 A 9/2005
GB 2 268 094 A 1/1994
(Continued)

OTHER PUBLICATIONS

Chinese Office Action, dated Apr. 22, 2014, for Chinese Application No. 201180009628.2.
(Continued)

Primary Examiner — Yewebdar T Tadesse
Assistant Examiner — Stephen A Kitt
(74) Attorney, Agent, or Firm — Birch, Stewart, Kolasch & Birch, LLP (57) ABSTRACT Particle production apparatus 1 including processing section 3 in which a processing liquid is adhered to a surface of each of inorganic particles contained in a powder material, chamber 4 connected to processing section 3 at a downstream side thereof in which the powder material is separated from gas carrying the material, powder material supply device 50 with supply portion 5 and supply unit 6 for supplying the powder material into processing section 3, and processing liquid spraying device 70 having a nozzle 7, a pump 8, a supply unit 9 for supplying the processing liquid, and a high-pressure gas (air) generating unit 11. Processing liquid spraying device 70 is configured to spray processing liquid as droplets onto the powder material just after the powder material being supplied into the processing section 3. Pref-
(Continued)

erably, a volume of the processing section 3 is smaller than a volume of the chamber 4.

19 Claims, 3 Drawing Sheets

(51) Int. Cl.
*H01L 21/56* (2006.01)
*H01L 23/29* (2006.01)

(52) U.S. Cl.
CPC .......... *H01L 21/565* (2013.01); *H01L 23/295* (2013.01); *H01L 2924/0002* (2013.01)

(56) References Cited

U.S. PATENT DOCUMENTS

2005/0220996 A1* 10/2005 Berger ................ A61K 9/2081
427/213
2005/0233074 A1 10/2005 Dalziel et al.
2006/0104871 A1 5/2006 Natsuyama et al.
2018/0044189 A1* 2/2018 Sumiyoshi ............... B01J 2/006

FOREIGN PATENT DOCUMENTS

| | | |
|---|---|---|
| JP | 6-99057 A | 4/1994 |
| JP | 11-512019 A | 10/1999 |
| JP | 2001-170473 A | 6/2001 |
| JP | 2003-275555 A | 9/2003 |
| JP | 2006-501051 A | 1/2006 |
| JP | 2007-175704 A | 7/2007 |
| JP | 2008-137854 A | 6/2008 |
| WO | WO 97/07879 A1 | 3/1997 |

OTHER PUBLICATIONS

International Search Report issued in PCT/JP2011/053914 dated Apr. 12, 2011.
Notice of Refusal dated Nov. 26, 2013, in Japanese Patent Application No. 2010-071116, with English translation.

* cited by examiner

PARTICLE PRODUCTION APPARATUS, PARTICLE PRODUCTION METHOD AND METHOD FOR PRODUCING SEMICONDUCTOR ENCAPSULATING RESIN COMPOSITION

This application is a Divisional of, and claims priority to, application Ser. No. 13/581,923, filed Aug. 30, 2012. Application Ser. No. 13/581,923 is the U.S. National Phase of PCT/JP2011/053914, filed Feb. 23, 2011. Priority is also claimed to Japanese patent application No. 2010-071116, filed in Japan on Mar. 25, 2010. All of these prior applications are hereby expressly incorporated by reference into the present application.

The present invention relates to a particle production apparatus, a particle production method and a method for producing a semiconductor encapsulating resin composition.

BACKGROUND OF THE INVENTION

There is known a semiconductor package in which a semiconductor chip (semiconductor element) is covered (encapsulated) with a resin-made encapsulating (sealing) material. The encapsulating material for the semiconductor chip is produced by molding a resin composition through, e.g., a transfer molding method.

A process for producing the resin composition from a powder material thereof includes a surface treatment process in which a processing liquid such as a coupling agent is allowed to adhere to surfaces of inorganic particles such as silica particles (filler material) contained in the powder material of the resin composition.

In this surface treatment process, the silica particles are injected into a chamber from an inlet port thereof, and the coupling agent is also sprayed into the chamber from an opposite side with respect to the inlet port while the silica particles are spirally swirled in the chamber (for example, see patent document 1). In this configuration, a part of the coupling agent is contacted with the silica particles upon spraying the coupling agent and the remaining coupling agent is swirled and contacted with the other silica particles in the chamber during swirling of the silica particles so that the coupling agent adheres to the surfaces of the silica particles. As a result, a mixing property of resin particles constituting the resin composition and the silica particles is enhanced, thereby easily mixing the silica particles and the resin particles since the silica particles are coated with the coupling agent.

However, according to the above method, in the surface treatment process, there is a problem in that the silica particles are aggregated. In this case, it is difficult to uniformly mix the silica particles (inorganic particles) with the resin particles (resin composition).

Patent Document 1: JP-A 2003-275555.

It is an object of the present invention to provide a particle production apparatus, a particle production method and a method for producing a semiconductor encapsulating resin composition, by which a processing liquid is allowed to adhere to inorganic particles contained in a powder material reliably while aggregation of the inorganic particles is suppressed.

In order to achieve the object, one aspect of the present invention is directed to a particle production apparatus which is configured so that a processing liquid adheres to a surface of each of inorganic particles contained in a powder material, the particle production apparatus comprising:

a processing section in which the processing liquid is allowed to adhere to the surface of each of the inorganic particles;

a chamber connected to the processing section at a downstream side thereof in which the powder material is separated from gas carrying the powder material;

a powder material supply device which supplies the powder material into the processing section; and a processing liquid spraying device which sprays the processing liquid as droplets to the powder material just after the powder material being supplied into the processing section, wherein after the processing liquid sprayed to the powder material adheres to the surface of each of the inorganic particles contained in the powder material in the processing section, the powder material is transferred into the chamber so that the powder material is separated from the gas.

In the particle production apparatus of the present invention, it is preferred that the processing liquid spraying device comprises: a nozzle; a gas supply device for supplying the gas having a pressure being equal to or higher than 0.3 MPa to the nozzle; and a processing liquid supply device for supplying the processing liquid into the nozzle, and wherein the processing liquid is sprayed from the nozzle into the processing section due to the pressure of the gas.

In the particle production apparatus of the present invention, it is preferred that the processing liquid supply device is a pump.

In the particle production apparatus of the present invention, it is preferred that the droplets of the processing liquid sprayed from the processing liquid spraying device include small-sized droplets having a particle size being equal to or less than 20 and the processing liquid spraying device is configured so that a ratio of the small-sized droplets to the total of the sprayed droplets becomes equal to or more than 80 wt %.

In the particle production apparatus of the present invention, it is preferred that the particle production apparatus is configured so that a swirl stream of the gas is generated in the chamber by spraying the processing liquid using the processing liquid spraying device.

In the particle production apparatus of the present invention, it is preferred that the chamber has a cylindrical shape and the processing section has a central axis and an outlet port connected to the chamber, wherein the processing section is connected to a side portion of the chamber such that the central axis of the processing section is inclined with respect to a direction of a radius of the chamber which passes through the outlet port of the processing section, and wherein the particle production apparatus is configured so that a swirl stream of the gas is generated in the chamber by spraying the processing liquid using the processing liquid spraying device.

In the particle production apparatus of the present invention, it is preferred that the inorganic particles are constituted of silica and the processing liquid is a coupling agent.

In order to achieve the object, another aspect of the present invention is directed to a particle production method by which a processing liquid is allowed to adhere to a surface of each of inorganic particles contained in a powder material, wherein the powder material is supplied into a processing section, and the processing liquid is sprayed as droplets to the powder material just after the powder material being supplied into the processing section, thereby allowing the processing liquid to adhere to the surface of each of the inorganic particles contained in the powder material, and then the powder material is transferred into a chamber so that the powder material is separated from gas carrying the powder material.

In the particle production method of the present invention, it is preferred that the processing liquid and the gas having a pressure being equal to or higher than 0.3 MPa are supplied into a nozzle so that the processing liquid is sprayed from the nozzle into the processing section.

In the particle production method of the present invention, it is preferred that an average particle size of the inorganic particles is in the range of 0.5 to 100 µm.

In the particle production method of the present invention, it is preferred that when the processing liquid is sprayed to the powder material so that the processing liquid adheres to the surface of each of the inorganic particles contained in the powder material, there is a case that the powder material includes aggregated particles each comprised of the inorganic particle and the adhering processing liquid wherein each aggregated particle having a particle size of 150 µm or more, but a ratio of such aggregated particles to the whole of the powder material is equal to or less than 1 wt % of the powder material.

In order to achieve the object, the other aspect of the present invention is directed to a method for producing a semiconductor encapsulating resin composition comprising:

allowing the processing liquid to adhere to the surface of each of the inorganic particles contained in the powder material by the particle production method of the present invention; and mixing a composition containing a powder material constituted of a resin and the powder material containing the inorganic particles to which the processing liquid adheres.

DETAILED DESCRIPTION OF THE PREFERRED EMBODIMENT

Hereinbelow, a particle production apparatus, a particle production method and a method for producing a semiconductor encapsulating (sealing) resin composition according to the present invention will be described in detail based on the preferred embodiments shown in the accompanying drawings.

Figure 1:
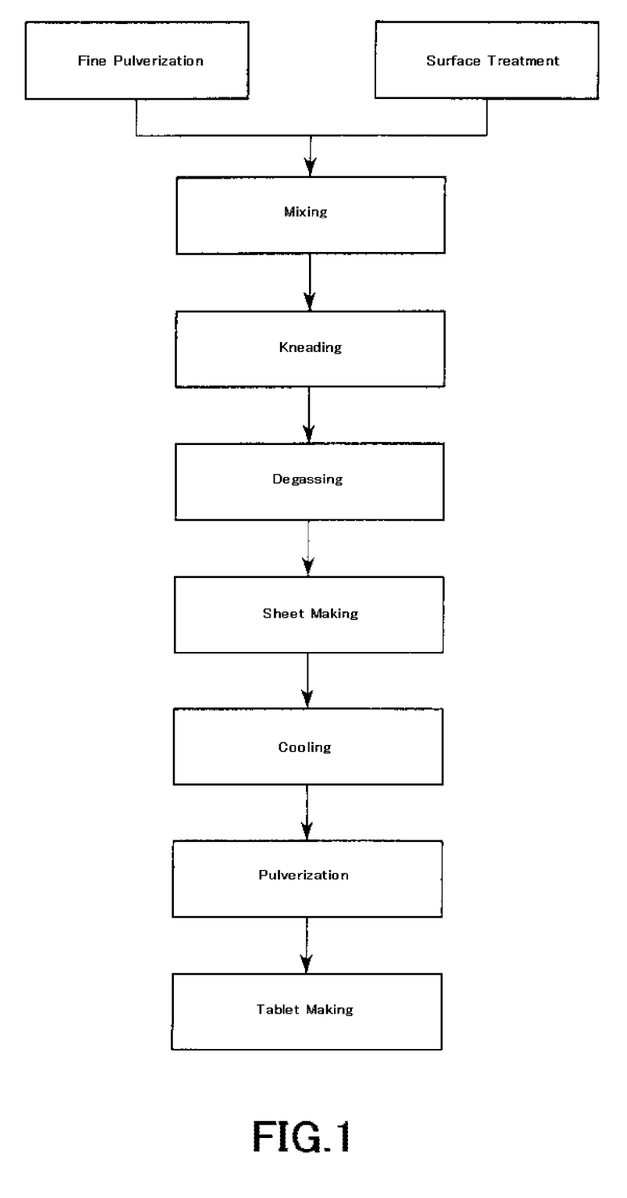
FIG. 1 is a process chart showing a producing process of a resin composition.
Figure 2:
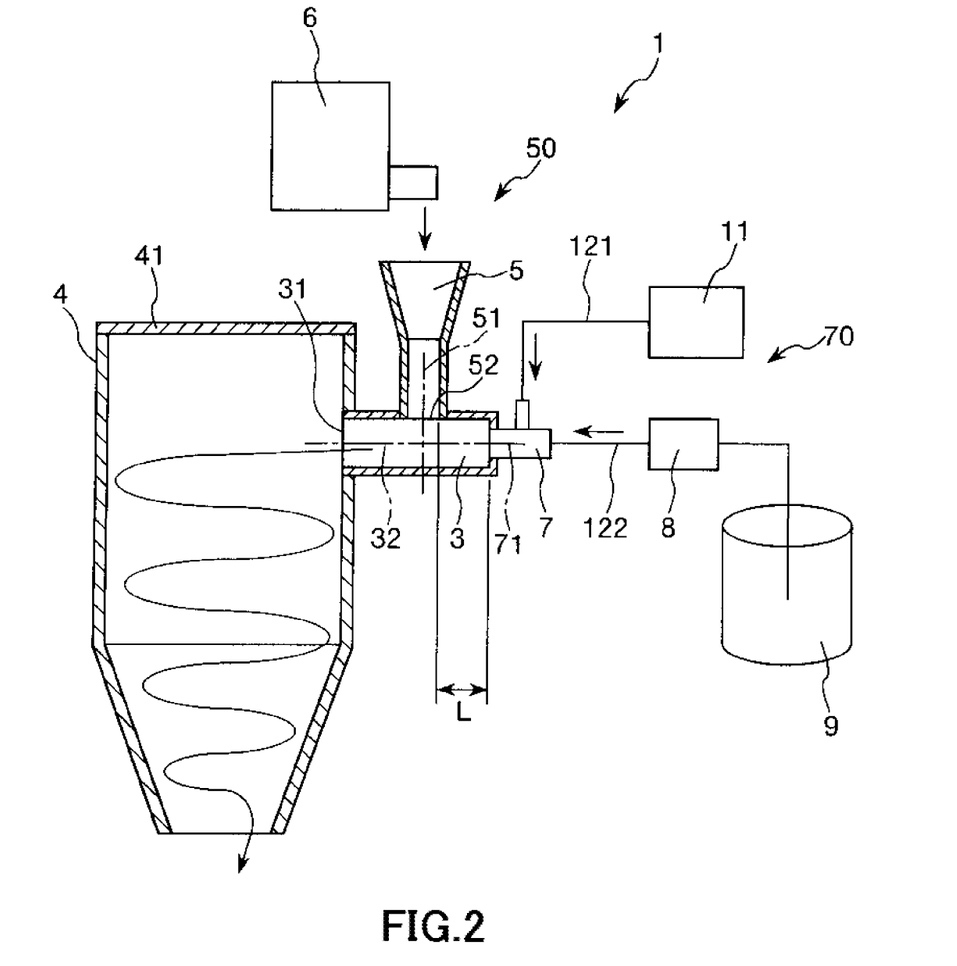
FIG. 2 is a cross section view (partial cross section view) schematically showing a particle production apparatus according to one embodiment of the present invention.
Figure 3:
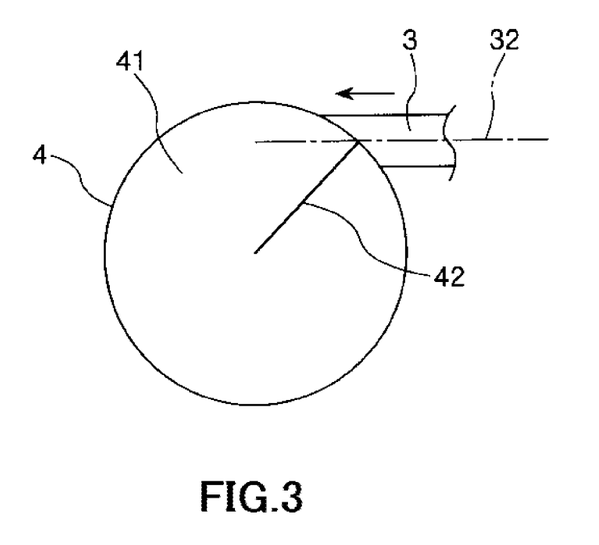
FIG. 3 is a plain view schematically showing a chamber and a processing section of the particle production apparatus shown in FIG. 2.

FIG. 1 is a process chart showing a producing process of a resin composition. FIG. 2 is a cross section view (partial cross section view) schematically showing a particle production apparatus according to one embodiment of the present invention. FIG. 3 is a plain view schematically showing a chamber and a processing section of the particle production apparatus shown in FIG. 2.

In the following description, the upper side in FIG. 2 will be referred to as "upper", the lower side will be referred to as "lower", the left side will be referred to as "left", and the right side will be referred to as "right".

A particle production apparatus 1 shown in FIG. 2 is an apparatus used in a surface treatment process (inorganic particle production process) to produce a resin composition as a molded body (compact). Prior to describing the particle production apparatus 1, description will be first made on the overall producing process which begins with the supply of raw materials and ends with the production of a resin composition for covering (encapsulating) a semiconductor chip (semiconductor element).

At first, individual materials as raw materials of the resin composition are prepared. The raw materials include a resin, a curing agent, a filler material (inorganic filler material, inorganic particles) and a coupling agent (processing liquid). If necessary, the raw materials may further include a curing accelerator. It is preferable to use an epoxy resin as the resin.

Examples of the epoxy resin include a cresol novolac type epoxy resin, a biphenyl type epoxy resin, a dicyclopentadiene type epoxy resin, a triphenol methane type epoxy resin and a multi-ring aromatic type epoxy resin.

Examples of the curing agent include a phenol novolac type resin, a phenol aralkyl type resin, a triphenol methane type resin and a multi-ring aromatic resin.

Examples of the filler material (inorganic filler material, inorganic particles) include silica such as a fused silica (having a crushed shape or a spherical shape) or a crystalline silica and an alumina.

Examples of the coupling agent include a silane coupling agent (silane compound) such as γ-glycidoxypropyltrimethoxysilane, γ-aminopropyltrimethoxysilane or γ-mercaptopropyltrimethoxysilane, vinyltriethoxysilane. Examples of the curing accelerator include a phosphor compound and an amine compound.

Specific one of the materials stated above may be excluded from the raw materials. Other materials than set forth above may be further included in the raw materials. Examples of the other materials include a coloring agent, a releasing agent, a flame retardant and a stress-reducing agent.

Examples of the flame retardant include a brominated epoxy resin, an antimony oxide based flame retardant, non-halo and non-antimony based flame retardant. Examples of the non-halo and non-antimony based flame retardant include organic phosphor, metal hydrate and a nitrogen-containing resin.

(Fine Pulverization)

As shown in FIG. 1, specific materials among the raw materials are first pulverized (finely pulverized) by a first pulverizing device to have a specified particle size distribution. Examples of the raw materials to be pulverized include the resin, the curing agent, the curing accelerator and other materials than the filler material. A part of the filler material may be added into the raw materials to be pulverized. As a result, a first composition including plural kinds of the pulverized materials such as the resin, the curing agent and the curing accelerator is obtained. As the first pulverizing device, it is possible to use a continuous rotary ball mill and so forth.

(Surface Treatment (Particle Production))

A specified material among the raw materials, that is, all or a part (remaining part) of the filler material (inorganic particles), is subjected to a surface treatment by the particle production apparatus 1. Namely, in the surface treatment, a processing liquid such as the coupling agent adheres to a surface of each of the inorganic particles. As a result, a second composition including a powder material containing the inorganic particles is obtained. As the coupling agent adheres to the surface of the filler material, a mixing property of the resin and the curing agent with the filler material is enhanced, thereby easily mixing the filler material with the resin.

The powder material of the filler material may be constituted of only the filler material. Other materials than the filler material may be further included in the powder material of the filler material. Further, the fine pulverization and the surface treatment may be performed either simultaneously or one after the other. The particle production apparatus 1 will be described later.

(Mixing)

Next, the first composition obtained in the fine pulverization process and the second composition obtained in the surface treatment process, namely, the resin composition including plural kinds of powder materials is mixed thoroughly by a mixing device. Each of the powder materials has a different specific gravity. As the mixing device, it is possible to use a high-speed mixing device having rotary blades or the like.

(Kneading)

Next, the resin composition is kneaded by a kneading device. As the kneading device, it is possible to use, a kneading extruder such as a single-axis type kneading extruder or a double-axis type kneading extruder, or a roll type kneader such as a mixing roll and so forth.

(Degassing)

Next, the resin composition thus kneaded is degassed by a degassing device.

(Sheet Making)

Next, the massive resin composition thus degassed is molded into a sheet shape by a sheet-making device. As a result, a sheet shaped resin composition (sheet shaped resin material) is obtained. As the sheet-making device, it is possible to use, e.g., a sheet-making roll.

(Cooling)

Next, the sheet shaped resin composition is cooled by a cooling device. This makes it possible to easily and reliably perform pulverization of the sheet shaped resin composition.

(Pulverization)

Next, the sheet shaped resin composition is pulverized by a second pulverizing device to have a specified particle size distribution. As a result, a pulverized composition is obtained. As the second pulverizing device, it is possible to use, e.g., a hammer mill, a knife mill or a pin mill.

In this regard, the granular or powdery resin composition may be obtained not by way of the sheet-making, cooling and pulverizing steps. Instead, the granular or powdery resin composition may be obtained by, e.g., a hot cutting method in which a die having a small diameter is installed in an outlet port (discharge passage) of the kneading device and a molten resin composition discharged from the die is cut by a cutter into granular resin composition having a specified length. After obtaining the granular resin composition by the hot cutting method, it is preferable to perform degassing while the temperature of the resin composition remains high.

(Tablet Making)

Next, the powder compositions are compression-molded by a compact manufacturing device (tablet-making device) to obtain resin composition in the form of compacts.

The resin composition are used in, e.g., covering (encapsulating) a semiconductor chip (semiconductor element). In other words, the resin composition is molded by, e.g., a transfer molding method. A semiconductor chip is covered with the molded resin composition as an encapsulating material, thus manufacturing a semiconductor package.

The tablet-making process may be omitted and the powdery resin composition may be used as final products. In this case, the encapsulating material can be formed by, e.g., a compression-molding method or an injection-molding method.

Next, description will be given to the particle production apparatus 1. As shown in FIGS. 2 and 3, the particle production apparatus 1 is an apparatus which is configured so that the processing liquid adheres to the surface of each of the inorganic particles contained in the powder material. The particle production apparatus 1 includes a processing section 3 in which the processing liquid is allowed to adhere to the surface of each of the inorganic particles, a chamber 4 connected to the processing section 3 at a downstream side thereof in which the powder material is separated from gas (air) carrying the powder material, a powder material supply device (inorganic particle supply device) 50 having a supply portion 5 and a supply unit 6 for supplying the powder material and the like into the processing section 3, and a processing liquid spraying device 70 having a nozzle 7, a pump 8, a supply unit 9 for supplying the processing liquid, a high-pressure gas (air) generating unit 11 and the like. The processing liquid spraying device 70 is configured to spray the processing liquid as droplets (in droplet state) onto the powder material just after the powder material being supplied into the processing section 3.

The chamber 4 has a side portion formed into a cylindrical (tubular) shape. A lower end portion of the chamber 4 is formed into a tapering shape having an inner diameter gradually decreasing from an upper side toward a lower side thereof. A lower opening of the chamber 4 constitutes (serves as) a discharge passage of the powder material having been processed (to which the processing liquid adheres).

A filter 41 which permits passage of the gas (air) but does not permit passage of the powder material and the processing liquid (liquid) is provided at an upper portion of the chamber 4. The filter 41 serves as an air vent portion for discharging therethrough the gas (air) existing within the chamber 4. Further, the filter 41 is arranged so as to close an upper opening of the chamber 4.

The receiving unit not shown in the drawings for receiving the powder material which has been processed in the chamber 4 and then discharging it from the chamber 4 is provided at the lower side of the chamber 4.

The processing section 3 has a cylindrical (tubular) shape whose one end side (upstream side) is closed. The processing section 3 is provided at an upper side of the side portion (lateral surface) of the chamber 4. An outlet port 31 of the processing section 3 is an aperture connected to an inside of the chamber 4. Further, the processing section 3 provided at the side portion of the chamber 4 is in a state that an axis line (central axis) 32 of the processing section 3 is inclined with respect to a direction of a radius of the chamber 4 that passes through the outlet port 31 (center of the outlet port 31) in a planar view. Due to this configuration of the processing section 3, when the processing liquid is sprayed by the processing liquid spraying device 70, it is possible to generate a swirl stream of the gas (air) in the chamber 4.

Each of dimensions of the processing section 3 and the chamber is not particularly limited to a specific value, but it is preferred that a volume of the processing section 3 is smaller than a volume of the chamber 4.

Specifically, the dimension of the processing section 3 is not particularly limited to a specific value if the processed powder material obtained by coupling the processing liquid injected (sprayed) from the nozzle 7 into the processing section 3 with the powder material supplied from an outlet port 52 of the supply portion 5 (described later) into the processing section 3 is discharged to the chamber 4 without adhering to a wall surface of the processing section 3. However, in this case, a radius of the processing section 3

(length in a vertical direction of the processing section shown in FIG. 2) is preferably in the range of 20 to 100 mm, and more preferably in the range of 30 to 80 mm. Simultaneously, a length of the processing section 3 (shortest length between a connecting portion of the processing section 3 with the chamber 4 and an installation surface of the nozzle 7 to the processing section 3) is preferably in the range of 50 to 250 mm, and more preferably in the range of 100 to 200 mm. If the radius of the processing section 3 is less than the lower limit value noted above or the length of the processing section 3 exceeds the upper limit value noted above, there is a possibility that the processing powder material adheres to the wall surface of the processing section 3. As a result, aggregation of the powder particles is generated or the processing of the powder particles is impeded. On the other hand, if the radius of the processing section 3 exceeds the upper limit value noted above or the length of the processing section 3 is less than the lower limit value noted above, there is a possibility that the swirl stream of the gas (air) generated in the chamber 4 flows into the processing section 3. As a result, the processing of the powder particles becomes unstable.

Further, the dimension of the chamber 4 is not particularly limited to a specific value if the swirl stream of the gas (air) can be generated in the chamber 4 and the powder material can be separated from the gas (air) in the chamber 4, but a radius of the chamber 4 is preferably equal to or more than 100 mm, and more preferably in the range of 200 to 300 mm. Simultaneously, a height of the chamber 4 is preferably equal to or more than 900 mm, and more preferably in the range of 1.5 to 3.0 m. If the radius and the height of the chamber 4 are less than the lower limit value noted above, there is a possibility that the swirl stream of the gas (air) generated in the chamber 4 is not sufficiently generated. As a result, clogging of the filter is generated. If the radius and the height of the chamber 4 are less than the preferable upper limit value, it is possible to decrease an area to which the powder material adheres in the chamber 4. As a result, an advantage of yield of the powder material becomes high.

The supply portion 5 is provided at an upper portion of the processing section 3. The supply portion 5 is connected to the processing section 3 and the powder material is supplied into the processing section 3. An upper end portion of the supply portion 5 is formed into a tapering shape having an inner diameter gradually increasing from a lower side toward an upper side thereof. An upper opening of the supply portion 5 serves as a supply port for the powder material and a lower opening of the supply portion 5 serves as the outlet port for the powder material.

The supply unit 6 for supplying the powder material into the supply portion 5 is provided at an upper side of the supply portion 5. The supply unit 6 is configured to adjust a flow rate of the powder material supplied into the supply portion 5.

A major portion of the powder material supply device 50 is constituted of the supply portion 5 and the supply unit 6.

Further, the nozzle 7 is installed in a right (upstream side) end portion of the processing section 3. The nozzle 7 is connected to the processing section 3 and sprays the processing liquid into the processing section 3. The nozzle 7 is arranged such that an axis line (central axis) 71 of the nozzle 7 is parallel to the axis line 32 of the processing section 3 (In the configuration shown in the drawings, the axis line 71 and the axis line 32 are arranged so as to correspond with each other).

Further, the axis line 71 of the nozzle 7 and an axis line (central axis) 51 of the supply portion 5 are intersected with each other (In the configuration shown in the drawings, the axis line 71 is perpendicular to the axis line 51). Namely, a spraying direction of the processing liquid from the nozzle 7 into the processing section 3 (a direction of a central line of the spraying direction in which the processing liquid is radially sprayed) and an injecting (introducing) direction of the powder material are intersected with each other.

Further, a gap is formed between a distal end portion of the nozzle 7 and the outlet port 52 of the supply portion 5. A distance of the gap L is not particularly limited to a specific value and is appropriately set depending on conditions, but is preferably in the range of about 0 to 50 mm, and more preferably in the range of about 5 to 20 mm.

If the distance of the gap L exceeds the upper limit value noted above, depending on the other conditions, there is a possibility that the processing liquid sprayed from the nozzle 7 adheres to the wall surface of the processing section 3 so that the appropriate processing of the powder material cannot be performed. Further, there is a possibility that the gas (air) including the processing liquid sprayed from the nozzle 7 is leaked from the supply portion 5, thereby interfering the supplying of the powder material from the powder material supply device 50. On the other hand, if the distance of the gap L is less than the lower limit value noted above (such a case that a value of the distance of the gap L is minus (the distal end portion of the nozzle 7 is protruded) is included), depending on the other conditions, there is a possibility that the powder material adheres to the distal end of the nozzle 7 so that the processing liquid cannot be stably supplied from the nozzle 7. Further, this causes generation of aggregation of the powder particles.

The high-pressure gas (air) generating unit 11 is connected to the nozzle 7 through a conduit line 121. The high-pressure gas generating unit 11 is a device for compressing gas (air) to feed a high-pressure gas (compressed gas) and is configured to adjust a flow rate and a pressure of the high-pressure gas. In this regard, one end portion of the conduit line 121 is connected to an upper portion of the nozzle 7.

Further, the supply unit 9 is connected to the nozzle 7 through a conduit line 122. The supply unit 9 is configured to adjust a flow rate of the processing liquid being supplied into the nozzle 7. The supply unit 9 can stably supply the processing liquid in cooperation with the pump 8 described later. In this regard, one end portion of the conduit line 121 is connected to a right (upstream side) end portion of the nozzle 7.

Further, the pump 8 for feeding the processing liquid (liquid) is provided at the middle of the conduit line 122 (between the nozzle 7 and the supply unit 9). By providing the pump 8 at the middle of the conduit line 122, the flow rate of the processing liquid can be reliably set to target values without being influenced by the gas fed by the high-pressure gas generating unit 11.

A major portion of the processing liquid spraying device 70 is constituted of the nozzle 7, the pump 8, the supply unit 9, the high-pressure gas generating unit 11 and the conduit lines 121 and 122.

Further, a major portion of a processing liquid supply device is constituted of the pump 8, the supply unit 9 and the conduit line 122.

Further, a major portion of a gas supply device is constituted of the high-pressure gas (air) generating unit 11 and the conduit line 121.

Next, description will be made on the surface treatment process (inorganic particle production process) and the operation of the particle production apparatus 1 in the surface treatment process. Hereinbelow, the description will be representatively made on a case that all of the powder material being subjected to the surface treatment process is constituted of the inorganic particles, but it is needless to say that the powder material may contain the other components than the inorganic particles.

(Surface Treatment Process)

In the surface treatment process, the processing liquid such as the coupling agent adheres to the surface of each of the all or a part of the inorganic particles as the filler material by the particle production apparatus 1, thereby manufacturing the inorganic particles to which the processing liquid adheres. This makes it possible to obtain the powder material containing the inorganic particles to which the processing liquid adheres (the second composition). As the processing liquid (coupling agent) adheres to the surface of the inorganic particles, that is, the inorganic particles are coated with the coupling agent, a mixing property of the resin and the curing agent with the inorganic particles is enhanced, thereby easily mixing the filler material with the resin.

In the surface treatment process, the inorganic particles (powder material) are received in the supply unit 6 and the processing liquid is stored in the supply unit 9.

An average particle size of the inorganic particles is not particularly limited to a specific value, but is preferably in the range of about 0.5 to 100 μm, and more preferably in the range of about 1 to 50 μm. This makes it possible to easily and uniformly mix the inorganic particles with the resin composition in the next (later) mixing process.

Next, the supply unit 6, the pump 8, the supply unit 9 and the high-pressure gas (air) generating unit 11 are driven, respectively.

By doing so, the high-pressure gas compressed (compressed gas) is fed from the high-pressure gas generating unit 11 and injected from the nozzle 7 into the processing section 3, and then the high-pressure air compressed is injected from the processing section 3 into the chamber 4. As a result, the swirl stream of the gas (gas and droplets of the processing liquid) is generated in the chamber 4. On the other hand, the processing liquid is supplied at a specific flow rate from the supply unit 9 and transferred into the nozzle 7 by the pump 8. As a result, the processing liquid is formed into fine droplets and injected from the nozzle 7 with the gas. Namely, the processing liquid is sprayed as fine particles from the nozzle 7 into the processing section 3.

A pressure of the gas supplied into the nozzle 7 is not particularly limited to a specific value and is appropriately set depending on conditions, but is preferably equal to or higher than 0.3 MPa, and more preferably in the range of 0.4 to 0.6 MPa.

If the pressure of the gas supplied into the nozzle 7 is less than the lower limit value noted above, depending on the other conditions, a particle size of each of the droplets of the processing liquid sprayed from the nozzle 7 become large so that it is difficult to form the preferable fine droplets of the processing liquid described later. Further, in this case, since dispersion property of the powder material supplied into the processing section 3 is low, it is difficult to uniformly process the powder material.

In this regard, the pressure of the gas supplied into the nozzle 7 can be adjusted by e.g., the high-pressure gas generating unit 11.

A particle size of each of the droplets of the processing liquid sprayed from the nozzle 7 is not particularly limited to a specific value and is appropriately set depending on conditions, but a ratio of the droplets (small-sized droplets) having a particle size being equal to or less than 20 μm to the total of the sprayed droplets is preferably equal to or more than 80 wt %, and more preferably in the range of 90 to 100 wt %.

If the ratio is less than the lower limit value noted above, depending on the other conditions, the inorganic particles are aggregated to thereby readily generate an aggregation of the inorganic particles when the processing liquid is sprayed onto the inorganic particles.

An average particle size of each of the droplets of the processing liquid sprayed from the nozzle 7 is not particularly limited to a specific value, but is preferably equal to or less than 20 μm, and more preferably in the range of 0.5 to 15 μm.

This makes it possible to suppress the aggregation of the inorganic particles when the processing liquid is sprayed onto the inorganic particles.

Further, when the average particle size of the droplets of the processing liquid sprayed from the nozzle 7 is "a" and the average particle size of the inorganic particles is "b", a/b is preferably equal to or less than 10, and more preferably in the range of about 0.02 to 1.

This makes it possible to suppress the aggregation of the inorganic particles when the processing liquid is sprayed onto the inorganic particles.

In this regard, a particle size distribution of the droplets of the processing liquid sprayed from the nozzle 7 can be measured by using a laser diffraction type spray particle size distribution measuring instrument. The ratio of the droplets having a particle size being equal to or less than 20 μm and the average particle size of the droplets can be calculated from a cumulative particle size distribution measured by the measuring instrument noted above.

The inorganic particles are supplied at a specific flow rate from the supply unit 6 and then supplied form the supply portion 5 into the processing section 3. The inorganic particles are fallen (transferred to a lower side of the supply portion 5), thereby being supplied into the processing section 3 by its own weight.

Just after the inorganic particles are supplied into the processing section 3, the processing liquid is sprayed to the inorganic particles from the nozzle 7, thereby allowing the processing liquid to adhere to the surface of each of inorganic particles. Thereafter, the inorganic particles thus processed are transferred and injected into the chamber 4 together with the gas and the processing liquid injected (sprayed) from the nozzle 7. And then, the inorganic particles are transferred to a lower side of the chamber 4 together with the gas and the processing liquid while the inorganic particles are swirled in the chamber 4. As a result, the inorganic particles coated with the processing liquid are discharged from the chamber 4 and then received in the receiving unit.

Further, an excess gas injected into the chamber 4 is separated from the inorganic particles and discharged to an outside of the chamber from the filter 41. This makes it possible to maintain the pressure in the chamber 4 at a specific value. As a result, the inorganic particles processed in the processing section 3 can be easily and reliably introduced into the chamber 4, thereby being received in the receiving unit.

In the inorganic particles thus processed, the aggregation of the inorganic particles (aggregated inorganic particles) is not generated, or even if the aggregation of the inorganic particles is generated, a particle size of the aggregated inorganic particles is small or an amount of the aggregated inorganic particles is small.

Specifically, a ratio of the aggregated inorganic particles having a size being equal to or more than 150 μm to the whole of the inorganic particles after being processed can be equal to or less than 1 wt %, especially equal to or less than 0.5 wt %.

This makes it possible to easily and reliably mix each of the powder materials with the resin composition uniformly in the mixing process.

As set forth above, according to the particle production apparatus 1, the processing liquid is sprayed to the powder material, thereby allowing the processing liquid to adhere to the surface of each of the inorganic particles contained in the powder material before the powder material is transferred into the chamber 4. This makes it possible to easily and reliably allow the processing liquid to adhere to the surface of each of the inorganic particles while the aggregation of the inorganic particles (powder material) is suppressed. As a result, in the mixing process, the inorganic particles can be easily and uniformly mixed with the resin composition.

Further, since the particle production apparatus 1 has a system in which the processing liquid adheres to the surface of each of the inorganic particles by spraying the processing liquid, it is possible to prevent (or suppress) metallic foreign substances from being mixed into the powder material having been processed in the surface treatment process (in manufacturing the inorganic particles). As a result, when a semiconductor chip is encapsulated by the resin composition thus produced, it is possible to prevent short circuit.

Furthermore, each of parts which makes contact with the powder material in the particle production apparatus 1 of the present invention is preferably constituted of a nonmetallic material. Examples of the nonmetallic material include a ceramics and a resin. This makes it possible to prevent (or suppress) metallic foreign substances from being mixed into the powder material having been processed in the surface treatment process (in manufacturing the inorganic particles). As a result, when the semiconductor chip is encapsulated by the resin composition thus produced, it is possible to prevent short circuit.

While the descriptions are given to the particle production apparatus, the particle production method and the method for producing semiconductor encapsulating resin composition according to the present invention shown in the drawings, the present invention is not limited thereto. Each component constituting the particle production apparatus may be substituted for an arbitrary component having the same function as it. Further, arbitrary structures also may be added thereto.

EXAMPLES

Next, description will be given to specific examples of the present invention.
<Raw Materials>
Raw materials used include following materials. Fused silica (fused silica particles, having an average particle size of 33 μm) is used as the inorganic particles.

γ-glycidoxypropyltrimethoxysilane (having a viscosity of 3.3 cSt at 25° C.) is used as the processing liquid (coupling agent) in Examples 1 and 2 and Comparative Example 1. N-phenyl-γ-aminopropyltrimethoxysilane (having a viscosity of 8.0 cSt at 25° C.) is used as the processing liquid in Example 3.

Example 1

The coupling agent adhered to the surface of the fused silica using the particle production apparatus 1 shown in FIG. 2 under the following condition:

the pressure of the air supplied into the nozzle being 0.5 MPa.

In this regard, a particle size distribution of droplets of the coupling agent sprayed from the nozzle having a ratio of the droplets having a particle size being equal to or less than 20 μm (small-sized droplets) to the total of the sprayed droplets was 98 wt %, wherein the average particle size of the droplets was 8 μm.

Example 2

The coupling agent adhered to the surface of the fused silica in the same manner as Example 1, except that the condition was changed to:

the pressure of the air supplied into the nozzle being 0.3 MPa.

In this regard, a particle size distribution of droplets of the coupling agent sprayed from the nozzle having a ratio of the droplets having a particle size being equal to or less than 20 μm to the total of the sprayed droplets was 96 wt %, wherein the average particle size of the droplets was 12 μm.

Example 3

The coupling agent adhered to the surface of the fused silica in the same manner as Example 1, except that the kind of the processing liquid (coupling agent) was changed as noted above.

In this regard, a particle size distribution of droplets of the coupling agent sprayed from the nozzle having a ratio of the droplets having a particle size being equal to or less than 20 μm to the total of droplets was 85 wt %, wherein the average particle size of the droplets was 18 μm.

Comparative Example 1

By using an apparatus shown in FIG. 4(c) of JP-A 2003-275555 (the patent document 1), the fused silica was injected into a chamber, and the coupling agent was sprayed into the chamber from an opposite side with respect to an inlet port from which the fused silica was injected while the fused silica was spirally swirled in the chamber. Thus, the coupling agent adhered to the surface of the fused silica under the following conditions:

the pressure of the air used in injecting the fused silica into the chamber being 0.5 MPa; and the pressure of the air used in spraying the coupling agent into the chamber being 0.5 MPa.

In this regard, a particle size distribution of droplets of the coupling agent sprayed into the chamber having a ratio of the droplets having a particle size being equal to or less than 20 μm to the total of the sprayed droplets was 98 wt %, wherein the average particle size of the droplets was 8 μm.

In Examples 1 to 3 and Comparative Example 1, the particle size distribution of the droplets of the coupling agent sprayed was measured by using a laser diffraction type spray particle size distribution measuring instrument (manufactured by NIKKISO CO., LTD). The ratio of the droplets having a particle size being equal to or less than 20 μm to the total of the sprayed droplets was calculated from a cumulative particle size distribution measured by this measuring instrument.

[Evaluation]

With regard to Examples 1 to 3 and Comparative Example 1, a ratio of the aggregated fused silica (fused silica particles) having a size being equal to or more than 150 μm to the whole of the total fused silica after being processed was evaluated by using a measuring instrument (Powder Tester manufactured by Hosokawa Micron Corporation) under the following conditions: an amplitude of 1 mm; the number of frequency of 3,000 VPM; a measuring time of 60 seconds; a sieve having apertures of 150 μm; and a sample weight of 6 g per time.

Example 1: 0.1 wt %
Example 2: 0.5 wt %
Example 3: 0.6 wt %
Comparative Example 1: 1.1 wt %

As it is apparent from the above evaluation, in Examples 1 to 3, a small amount of the aggregated fused silica was generated, and satisfactory result was obtained.

In contrast, in Comparative Example 1, since a supply position of the fused silica is spaced apart from a supply position of the coupling agent, there is a low probability of collision between the fused silica and the coupling agent. For the reason, the surface treatment to the fused silica was unevenly. Further, the fused silica swirled in the chamber adhered to a nozzle for supplying the coupling agent to thereby generate an aggregation substance of the silica at the nozzle. As a result, a large amount of the aggregated fused silica was generated.

INDUSTRIAL APPLICABILITY

With the present invention, it is possible to easily and reliably allow the processing liquid to adhere to the surface of each of the inorganic particles while the aggregation of the inorganic particles (powder material) is suppressed. As a result, in the mixing process for mixing the resin composition, the inorganic particles can be easily and uniformly mixed with the resin composition. For the reasons stated above, the present invention is industrially applicable.

What is claimed is:

1. A method for producing a semiconductor sealing resin composition, said method comprising:
    allowing a processing liquid to adhere to a surface of each of inorganic particles contained in a powder material with a particle production apparatus, wherein the particle production apparatus comprises:
    a chamber including a side portion having a cylindrical shape, wherein in the chamber the powder material is separated from gas carrying the powder material;
    a processing section including a tubular portion with two ends, an outlet port provided at one of the ends and a wall portion provided at the other end and having a through-hole, the tubular portion of the processing section directly connected to the side portion of the chamber through the outlet port of the processing section so as to protrude from the chamber, wherein in the processing section the processing liquid is allowed to adhere to the surface of each of the inorganic particles;
    a processing liquid spraying device including a nozzle having a distal end, the nozzle connected to the wall portion of the processing section via the through-hole of the wall portion; and
    a powder material supply device including a supply portion having an outlet port, said outlet port having an edge closest to the nozzle, the supply portion connected to the tubular portion of the processing section through the outlet port of the supply portion such that a gap is formed along a longitudinal direction of the nozzle between the distal end of the nozzle and the edge of the outlet port of the supply portion closest to the nozzle,
    wherein the step of allowing the processing liquid to adhere to the particle surfaces comprises:
    supplying the powder material into the processing section;
    spraying the processing liquid as droplets to the powder material just after the powder material is supplied into the processing section; and
    transferring the powder material into the chamber so that the powder material is separated from the gas carrying the powder material; and
    mixing a composition comprising the powder material containing the inorganic particles to which the processing liquid is adhered and a composition comprising a powder material constituted of a resin.

2. The method for producing the semiconductor sealing resin composition as claimed in claim 1, wherein the processing liquid and a gas having a pressure being equal to or higher than 0.3 MPa are supplied to the nozzle so that the processing liquid is sprayed from the nozzle into the processing section.

3. The method for producing the semiconductor sealing resin composition as claimed in claim 1, wherein an average particle size of the inorganic particles is in the range of 0.5 to 100 μm.

4. The method for producing the semiconductor sealing resin composition as claimed in claim 1, wherein when the processing liquid is sprayed to the powder material so that the processing liquid adheres to the surface of each of the inorganic particles contained in the powder material, there is a case that the powder material includes aggregated particles each comprised of the inorganic particle and the adhering processing liquid wherein each aggregated particle having a particle size of 150 μm or more, but a ratio of such aggregated particles to the whole of the powder material is equal to or less than 1 wt % of the powder material.

5. The method for producing the semiconductor sealing resin composition as claimed in claim 1, wherein a ratio of the droplets having a particle size being equal to or less than 20 μm to the total of the sprayed droplets is in the range of 80 to 100 wt %.

6. The method for producing the semiconductor sealing resin composition as claimed in claim 5, wherein an average particle size of the droplets of the processing liquid sprayed from the nozzle is in the range of 0.5 to 20 μm.

7. The method for producing the semiconductor sealing resin composition as claimed in claim 6, wherein when the average particle size of the droplets of the processing liquid sprayed from the nozzle is "a" and the average particle size of the inorganic particles is "b", a/b is in the range of about 0.02 to 1.

8. The method for producing the semiconductor sealing resin composition as claimed in claim 1, wherein the inorganic particles are constituted of silica and the processing liquid is a coupling agent.

9. The method for producing the semiconductor sealing resin composition as claimed in claim 1, wherein a radius of the processing section is in the range of 20 to 100 mm and a length thereof is in the range of 50 to 250 mm.

10. The method for producing the semiconductor sealing resin composition as claimed in claim 1, wherein a distance of the gap is in the range of 5 to 20 mm.

11. The method for producing the semiconductor sealing resin composition as claimed in claim 1, wherein the chamber is provided in a vertical direction and the processing section protrudes from the chamber in a horizontal direction.

12. The method for producing the semiconductor sealing resin composition as claimed in claim 1, wherein the mixing is performed by a high-speed mixing device having rotary blades to obtain a mixed resin composition as the semiconductor sealing resin composition.

13. The method for producing the semiconductor sealing resin composition as claimed in claim 12 further comprising kneading the mixed resin composition by a kneading device to obtain a kneaded resin composition.

14. The method for producing the semiconductor sealing resin composition as claimed in claim 13 further comprising degassing the kneaded resin composition by a degassing device to obtain a degassed resin composition.

15. The method for producing the semiconductor sealing resin composition as claimed in claim 14 further comprising molding the degassed resin composition into a sheet shape by a sheet-making device to obtain a sheet shape resin composition.

16. The method for producing the semiconductor sealing resin composition as claimed in claim 15 further comprising cooling the sheet shape resin composition by a cooling device.

17. The method for producing the semiconductor sealing resin composition as claimed in claim 16 further comprising pulverizing the sheet shape resin composition by a pulverizing device to obtain a powdery resin composition.

18. The method for producing the semiconductor sealing resin composition as claimed in claim 17 further comprising compression-molding the powdery resin composition by a compact manufacturing device to obtain the semiconductor sealing resin composition in the form of compact.

19. The method for producing the semiconductor sealing resin composition as claimed in claim 13 further comprising cutting the kneaded resin composition by a hot cutting method to obtain a granular resin composition.

* * * * *